United States Patent [19]

Hanzawa et al.

[11] Patent Number: 5,506,454
[45] Date of Patent: Apr. 9, 1996

[54] SYSTEM AND METHOD FOR DIAGNOSING CHARACTERISTICS OF ACCELERATION SENSOR

[75] Inventors: Keiji Hanzawa, Mito; Tetsuo Matsukura, Katsuta; Hirokazu Fujita, Kobe; Masayoshi Suzuki, Hitachiota; Masahiro Matsumoto, Hitachi, all of Japan

[73] Assignees: Hitachi, Ltd., Tokyo; Hitachi Automotive Engineering Co., Ltd., Ibaraki, both of Japan

[21] Appl. No.: 59,069

[22] Filed: May 10, 1993

Related U.S. Application Data

[63] Continuation-in-part of Ser. No. 852,662, Mar. 17, 1992.

[30] Foreign Application Priority Data

Mar. 20, 1991 [JP] Japan ................................ 3-055375
May 19, 1992 [JP] Japan ................................ 4-125897

[51] Int. Cl.⁶ .................................................. B60R 21/08
[52] U.S. Cl. .......................... 307/10.1; 307/9.1; 280/735; 180/272
[58] Field of Search ............................... 307/10.1, 9.1; 280/734–736; 340/466, 467, 457, 429, 436–438; 180/272–273; 310/311, 317, 315, 319, 324, 326, 329

[56] References Cited

U.S. PATENT DOCUMENTS

| | | | |
|---|---|---|---|
| 4,638,179 | 1/1987 | Matles et al. | 307/10 |
| 4,869,092 | 9/1989 | Bernard et al. | 73/1 D |
| 4,950,914 | 8/1990 | Kurihara et al. | 307/10.1 |
| 5,103,667 | 4/1992 | Allen et al. | 73/1 |

FOREIGN PATENT DOCUMENTS 2-95952  6/1990  Japan.

OTHER PUBLICATIONS

Reichl, Herbert, Micro System Technologies, Sep. 21, 1992, pp. 383–392.

Primary Examiner—Peter S. Wong
Assistant Examiner—Aditya Krishnan
Attorney, Agent, or Firm—Antonelli, Terry, Stout & Kraus

[57] ABSTRACT

An apparatus for diagnosing the characteristic of an acceleration sensor and a method for diagnosis thereof are disclosed. The acceleration sensor includes a movable electrode (or mass part) displaced in accordance with an acceleration and a fixed electrode disposed opposite to the movable electrode. In a diagnosis mode, a signal for diagnosis is applied to the fixed electrode so that an electrostatic force as a force corresponding to a predetermined acceleration is generated between the fixed electrode and the movable electrode. In the case where the acceleration sensor is sound, the movable electrode or mass part is normally displaced. A failure of the acceleration sensor, the deterioration thereof in performance, a change in characteristic thereof caused from the lapse of time, or the like is self-diagnosed by detecting a change in capacitance between the movable electrode and the fixed electrode upon generation of the diagnosis signal. The force corresponding to the predetermined acceleration may be an electromagnetic force or a mechanical oscillation based on a piezoelectric element.

10 Claims, 7 Drawing Sheets

SYSTEM AND METHOD FOR DIAGNOSING CHARACTERISTICS OF ACCELERATION SENSOR

CROSS-REFERENCE TO RELATED APPLICATION

This is a continuation-in-part application of U.S. application Ser. No. 07/852,662 filed on Mar. 17, 1992, all disclosure of which is incorporated herein by reference.

BACKGROUND OF THE INVENTION

The present invention is directed to a system and method for diagnosing the characteristics of an acceleration sensor inclusive of the deterioration in characteristic thereof, a failure thereof and so on, and more particularly to a diagnosing system and method suitable for an air bag system of an automobile or the like.

Typical examples of a sensor for detecting the acceleration of an automobile include a capacitance type sensor and a piezoresistive (or strain gage) type sensor. In the acceleration sensors of these types, the state of a mass part displaced in accordance with an acceleration is detected from a change in capacitance or a strain.

As a capacitance type acceleration sensor is known one which is formed by a technique for micromachining of silicon or the like. In this known sensor, a pulse width modulation servo technique is applied, as disclosed by JP-A-1-253657.

The acceleration sensor using the pulse width modulation servo technique includes a movable electrode (or mass part) displaced in accordance with an acceleration and at least one pair of fixed electrodes disposed opposite to the movable electrode. One of the pair of fixed electrodes is applied with a voltage in a pulse train form and the other thereof is applied with an inverted version of the pulse voltage. An electrostatic force enabling a control in position of the movable electrode (or an electrostatic servo control) is exerted between the fixed electrodes and the movable electrode by virtue of the applied voltages. When the movable electrode is displaced from a reference position, the displacement is detected from a change in capacitance between the movable electrode and the fixed electrodes.

The electrostatic force is variably controlled by changing the proportion of the application time of the voltage applied to the fixed electrode per a unit period on the basis of a signal representative of the change of the capacitance so that the movable electrode returns to the reference position or the capacitance takes a reference value. The acceleration is detected on the basis of the average value of the voltage applied to the fixed electrode or the signal representative of the change of the capacitance.

There is also known a capacitance type acceleration sensor in which an electrostatic servo is not applied.

U.S. Pat. No. 4,869,092 has disclosed a device for calibration of an acceleration sensor and, more particularly, a technique for calibrating the acceleration sensor by use of an electrostatic force in order to attain a high-precision calibration.

SUMMARY OF THE INVENTION

An acceleration sensor for automobile is used for a vehicle control such as an active suspension control or antiskid brake control or an air bag system. However, the use environment of the sensor is severe and a high reliability is required for the sensor. Therefore, a fail safe system with respect to a failure of the sensor or the deterioration in performance thereof is required.

Especially, the acceleration sensor used in the air bag system is requested to have a higher reliability than another sensor since there is a possibility that when the sensor encounters a failure, a deterioration in performance or a change in characteristic caused from the lapse of time, there is a possibility that the air bag may not operate at the time of vehicle collision (or crash) or may erroneously operate at a time other than the time of vehicle collision, which may result in a fatal accident.

An object of the present invention made in light of the above problem is to detect the abnormality of an acceleration sensor inclusive of a failure of the sensor and the deterioration in performance thereof, a change in characteristic thereof resulting from the lapse of time, and so on, thereby improving a fail-safe function.

To achieve the above object or to solve the above problem, the present invention provides an acceleration sensor provided with a mass part displaced in accordance with an acceleration for converting the displacement of the mass part into an electric signal to detect the acceleration, comprising means for applying a force corresponding to a predetermined acceleration to the mass part by applying a signal for diagnosis of a failure or the like of the sensor to the sensor and means for self-diagnosing the sensor on the basis of an output of the sensor upon generation of the diagnosis signal.

With such a construction, when a change from a usual acceleration detection mode to a diagnosis mode is made so that a signal for diagnosis is generated, a force (for example, an electrostatic force, an electromagnetic force or a mechanical oscillation) corresponding to an acceleration caused upon collision is applied to the mass part on the basis of the diagnosis signal.

In the case, if the mass part is normally displaced so that the sensor outputs a detection signal corresponding to the normal displacement of the mass part, there is no abnormality. But, if a detecting system involves an abnormality such as a failure or the deterioration of performance, no detection signal may be outputted from the sensor or an output characteristic of the sensor may not exhibit a proper configuration. The state of the sensor inclusive of the mass part concerning the performance thereof can be self-diagnosed by comparing a sensor output based on the diagnosis signal with a judging level for diagnosis. A fail-safe function of a system can be operated on the basis of the result of diagnosis.

The characteristic or the like of the acceleration sensor may be detected at the point of time when a starter motor is started. Alternatively, it may be detected always.

DESCRIPTION OF THE PREFERRED EMBODIMENTS

Figure 1A:
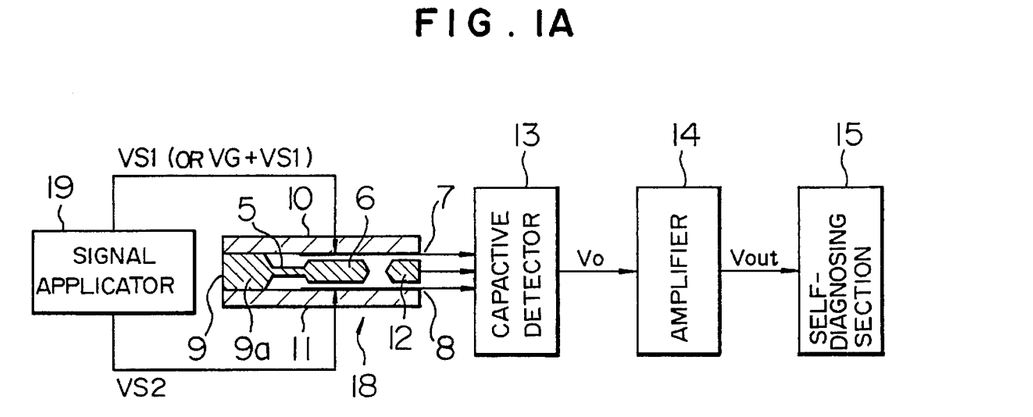
FIG. 1A is a block diagram showing an acceleration sensor according to an embodiment of the present invention.
Figure 1B:
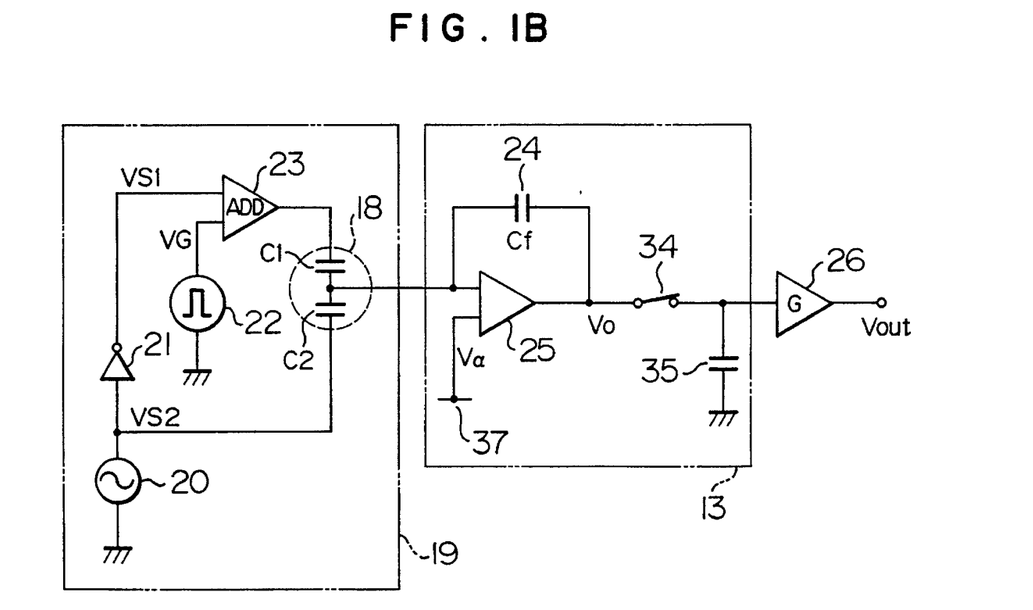
FIG. 1B is a circuit diagram showing the details of a signal applicator and a capacitive detector in the embodiment shown in FIG. 1A.

FIG. 1 is a block diagram for explaining the principle of operation of a capacitance type acceleration sensor according to an embodiment of the present invention, and FIG. 2 is a circuit diagram of the acceleration sensor.

The sensor of the present embodiment includes a signal applicator 9, an acceleration sensing device 18, a capacitive detector 13, and an amplifier 14.

The sensing device 18 is composed of a movable electrode 6 supported by a silicon beam (or a cantilever) 5 and a pair of fixed electrodes 7 and 8 disposed opposite to the movable electrode 6.

The silicon beam 5 and the movable electrode 6 are formed in an united form by etching (or micromachining) a silicon 9 from both surfaces thereof. The beam 5 may be single or plural in number. The movable electrode 6 corresponding to a mass part displaced in accordance with an acceleration is formed at the tip of the beam 5. The remaining part of the silicon 9 includes spacers 9a and 12 which enclose the movable electrode 6.

The fixed electrodes 7 and 8 are made of a metal material such as aluminum and are respectively formed on glass plates 10 and 11 by deposition or other proper technique. The glass plates 10 and 11 are disposed to be parallel to each other through the spacers 9a and 12 with the fixed electrodes 7 and 8 being positionally aligned with the movable electrode 6 and are anodic-bonded to the spacers 9a and 12. An initial gap $d_0$ is kept between movable electrode 6 and each of the fixed electrodes 7 and 8. The sensing device 18 is placed, for example, in a direction in which the running direction of an automobile becomes substantially perpendicular to the direction of extension of the cantilever 5.

The signal applicator 19 serves as means for applying signals VS1 and VS2 necessary for acceleration detection (as will be mentioned later on) to the fixed electrodes 7 and 8 in a usual acceleration detection mode and means for applying a signal VG for diagnosis added to VS1 to one fixed electrode 7 in a diagnosis mode so that a force corresponding to an acceleration is exerted onto the movable electrode 6.

The movable electrode 6 is applied with an inertia force due to the acceleration to be detected so that it is displaced thereby. When the movable electrode 6 is displaced, a capacitance C1 between the movable electrode 6 and the fixed electrode 7 and a capacitance C2 between the movable electrode 6 and the fixed electrode 8 change.

The capacitive detector 13 detects a difference ΔC between C1 and C2 by virtue of an AC pulse voltage VS2 generated by the signal applicator 19 and an inverted version VS1 thereof and outputs it after conversion into a voltage. A mechanism for detection of ΔC will be mentioned later on. An output voltage Vo from the capacitive detector 13 is amplified or adjusted by the amplifier 14 to obtain a linear output voltage Vout which is proportional to the acceleration.

With such a construction, a high acceleration (on the order of ±100 G) can be detected up to a relatively high frequency (on the order of 1 KHz) with a construction which is low in cost and simple.

An example of a specific circuit construction of the acceleration sensor will now be explained by use of FIG. 1B.

In the shown sensor circuit, a pulse generator 20 and an inverter 21 are constituent elements of the signal applicator 19. In a non-diagnosis mode (or usual acceleration detection mode) in which a voltage VG from a power supply 22 for self-diagnosis is generated, an output voltage VS1 inverted by the inverter 21 is applied to the fixed electrode 7 through an adder circuit 23 as it is. An output voltage VS2 from the pulse generator 20 is applied to the fixed electrode 8.

The sensing device 18 includes an equivalent series connection of capacitors C1 and C2. A middle point of the series connection is connected to an inverted terminal of an operational amplifier 25 and a constant voltage source 37 of a reference voltage Vα is connected to a non-inverted terminal of the operational amplifier 25.

When the AC pulse voltage VS1 rises (or VS2 falls), C1 is charged and C2 is discharged. In this case, charges look as if they move from C1 or C2 to a capacitor Cf on the operational amplifier 25 side due to a current flowing upon charging/discharging. Charges Q1 moving from C1 to Cf and charges Q2 moving from C2 to Cf are represented by $$\left.\begin{array}{l} Q1 = C1 \cdot VS \\ Q2 = -C2 \cdot VS \end{array}\right\} \quad (1)$$

where VS is the peak value of the AC voltage VS1 or VS2. VS is such that it is small as compared with the self-diagnosis voltage VG (which will be mentioned later on) and an electrostatic force exerted onto the movable electrode, when only VS is applied, becomes small so that it is negligible.

Charges Qf stored by the capacitance Cf take the sum of Q1 and Q2 and are represented by the following equation:

$$Qf=Q1+Q2=(C1-C2)VS. \quad (2)$$

Also, a voltage V across the capacitance Cf is represented by the following equation:

$$V=Qf/Cf=(C1-C2)VS/Cf. \quad (3)$$

Since an output Vo of the operational amplifier 25 is a version of the voltage V across the capacitance Cf inverted in polarity, Vo is represented by the following equation:

$$Vo=-(C1-C2)VS/Cf+V\alpha. \quad (4)$$

Thus, the capacitance difference ΔC between C1 and C2, when the movable electrode 6 is displaced in accordance with the acceleration, is converted into the voltage Vo. A switch 34 is closed in synchronism with the rise of the voltage VS1, and the voltage Vo is sampled and held by a capacitor 35 and is amplified by an amplifier 26 as an output voltage Vout. In this manner, the acceleration is detected in a form converted into an electric signal.

Explanation will now be made of the operation of the acceleration sensor in a self-diagnosis mode.

In the present embodiment, means for applying an electrostatic force corresponding to an acceleration to the movable electrode (or mass part) 6 by the diagnosis signal VG is constructed by one fixed electrode 7 for acceleration detection, the voltage source 22 for diagnosis and the adder circuit 23.

Figure 2A:
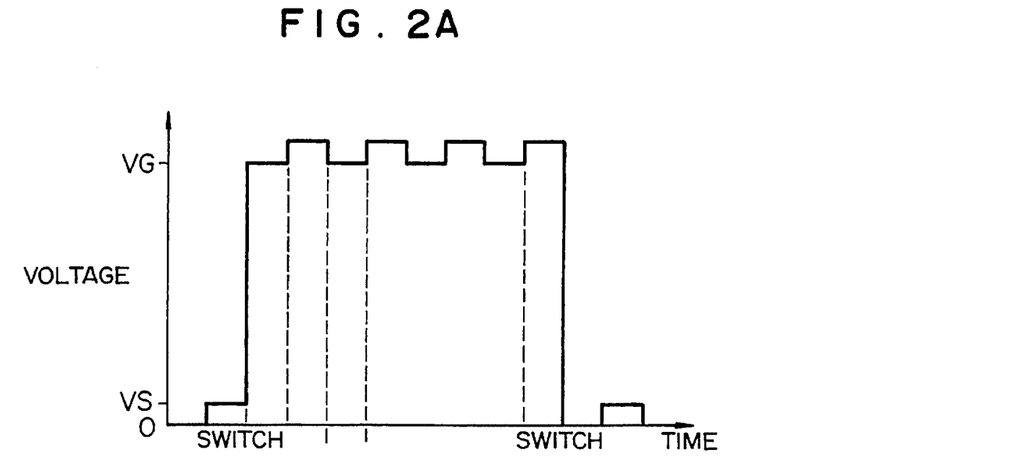
FIGS. 2A and 2B show voltage waveforms applied to a sensing device in a diagnosis mode in the embodiment shown in FIG. 1A.
Figure 2B:
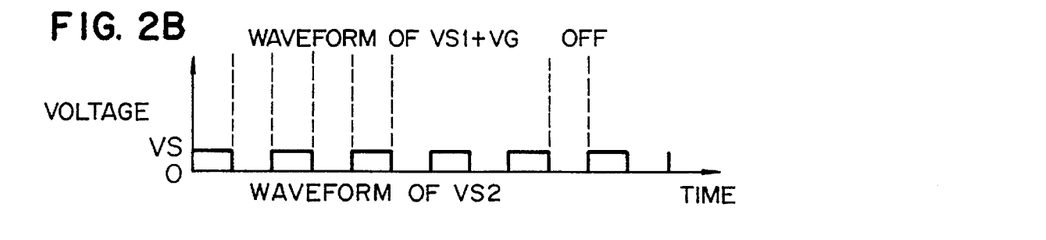

Only in the diagnosis mode, the voltage VG from the voltage source 22 for diagnosis is inputted to the adder circuit 23 which in turn adds VG to the voltage VS1 from the inverter 21. A voltage waveform applied to the sensing device 18 at this time is shown in FIGS. 2A and 2B. As shown in FIG. 2A, the voltage of VG+VS1 is applied to the fixed electrode 7 and the amplitude thereof is such that an electrostatic force corresponding to an acceleration is generated between the fixed electrode 7 and the movable electrode 6. Thereby, the movable electrode 6 is forcibly displaced to the fixed electrode 7 side.

Provided that a distance between the fixed electrode 7 and the movable electrode, the area of the movable electrode 6 and the dielectric constant between the fixed electrode 7 and the movable electrode 6 are d, S and $\epsilon$, an electrostatic force Fs exerted between the fixed electrode 7 and the movable electrode 6 is represented by the following equation:

$$Fs = \epsilon \cdot S \cdot VG^2 / 2d^2. \quad (5)$$

Namely, this electrostatic force causes the movable electrode 6 to displace to the fixed electrode 7 side so that a capacitance C1 formed between the fixed electrode 7 and the movable electrode 6 is increased while a capacitance C2 formed between the fixed electrode 8 and the movable electrode 6 is decreased.

Figure 3:
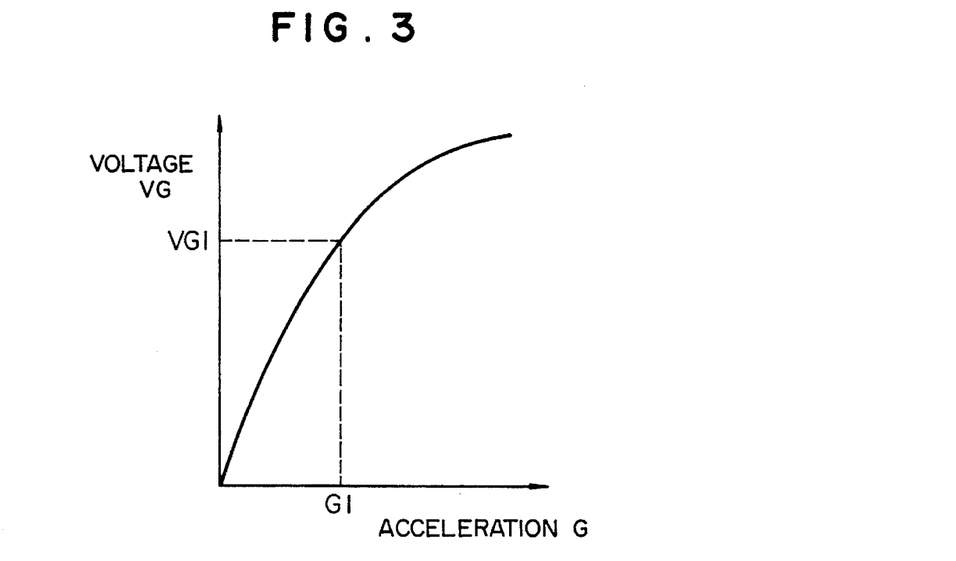
FIG. 3 is a graph showing a relation of a DC voltage VG for self-diagnosis with the measured acceleration G.

In this state, AC voltages VS1 and VS2 for capacitance detection are applied to the fixed electrodes 7 and 8, respectively. Then, the capacitive detector 13 composed of the capacitor 24 and the operational amplifier 25 detects a difference C between the capacitance C1 and the capacitance C2 on the basis of the principle of detection similar to that in the case of the abovementioned acceleration detection. FIG. 3 shows a relationship between the measured acceleration G and the DC voltage VG for self-diagnosis.

Upon measurement of the acceleration, an inertia force Fa and a drag Ft from the cantilever 5 balances with each other. Therefore, the displacement x of the movable electrode 6 from a reference position is represented by $$x = mG/kt \quad (6)$$

where kt is the spring constant of the cantilever 5.

The following equation (7) is derived from equations (5) and (6):

$$(d-x)^2 x = \epsilon \cdot S \cdot VG^2 / 2kt. \quad (7)$$

The following equation (8) is obtained from equations (6) and (7):

$$VG = \left( d - \frac{mG}{kt} \right) \sqrt{\frac{2mG}{\epsilon S}} \quad (8)$$

A relationship between the acceleration G and the self-diagnosis voltage VG represented by equation (8) is graphically shown in FIG. 3.

From FIG. 3, it can be understood that the amount of displacement of the movable electrode 6 due to an electrostatic force Fs generated in the case where a certain voltage VG1 is applied for self-diagnosis, is equal to that of the movable electrode 6 in the case where an acceleration G1 is applied.

Accordingly, an output voltage of the sensor when the self-diagnosis voltage VG1 is applied, becomes equal to an output thereof when the acceleration G1 is applied. By utilizing this characteristic, it is possible to diagnose whether or not the static characteristic of the sensor output (or a sensor output value characteristic to be primarily obtained for the acceleration) involves a change caused from the lapse of time. By measuring a time until the output voltage of the sensor reaches a certain level, it is also possible to diagnose the dynamic characteristic of the sensor (or a sensor output transient response for the acceleration). One example of the diagnosing means will be mentioned later on in conjunction with an air bag system shown in FIG. 9.

Figure 4A:
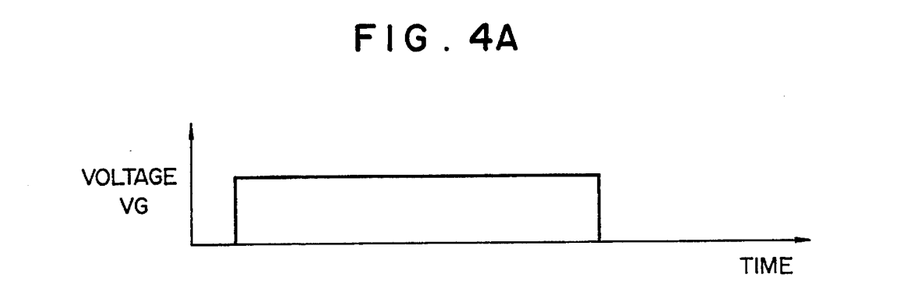
FIGS. 4A and 4B show in waveform diagrams the temporal changes of the self-diagnosis voltage VG and an output voltage Vout.
Figure 4B:
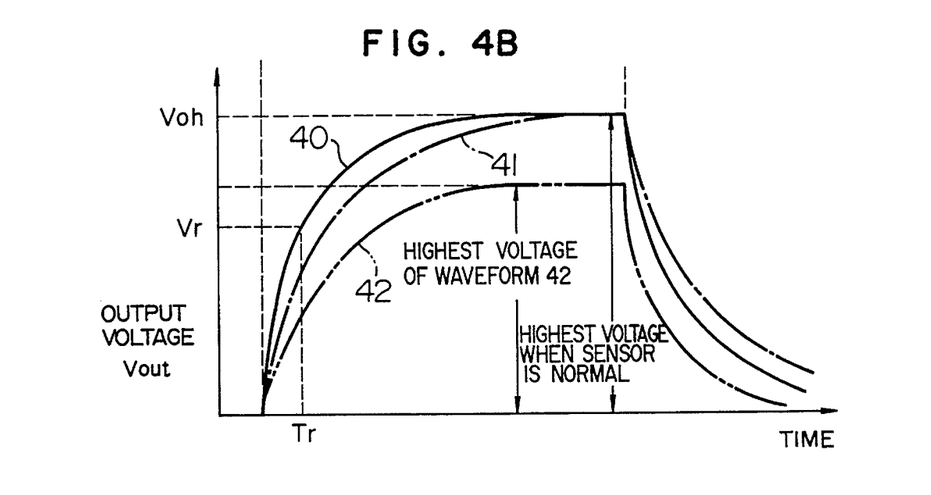

FIGS. 4A and 4B shows a relationship between a diagnosis signal (or pulse VG) used for the above-mentioned diagnosis and an output voltage Vout of the sensor.

A failure of the sensor can be self-diagnosed, for example, in such a manner that an electronic circuit or microcomputer reads a time Tr (or a time constant) until the output voltage Vout becomes a voltage Vr which is 63% of the highest output voltage Voh and the judgement is made of whether Tr is shorter or longer than a reference time to be compared. Namely, assume that a response waveform as shown by a curve 40 is a normal output. Then, in the case where a response waveform as shown by a curve 41 or 42 is obtained or there becomes longer the time Tr until the output voltage becomes Vr, the dynamic characteristic of the sensor is self-diagnosed as being deteriorated.

Also, by comparing the highest sensor output voltage obtained in the diagnosis mode with a normal value, as mentioned above, it is possible to self-diagnose a failure of the sensor or a change in static characteristic thereof caused from the lapse of time. For example, in the case where the curve 42 is obtained, the sensor is diagnosed as being inferior.

In the present embodiment, the failure of a sensor, the deterioration in characteristic thereof and the change in characteristic thereof caused from the lapse of time are self-diagnosed from the dynamic and static characteristics of the sensor as mentioned above.

With such a self-diagnosis function, the security of a proper control of the sensor and the provision of a fail-safe function such as prevention of an erroneous operation can be attained always by displaying notice that a detecting system of the acceleration sensor is faulty or by providing means (such as a microcomputer) for making a correction for a change in static or dynamic characteristic of the sensor caused from the lapse of time in the case where the change is in a level or degree at which it does not result in a failure. Also, if the latter correction function is provided, there is an effect that not only an erroneous operation of the system can be prevented but also the need for interchange of parts is eliminated, thereby making it possible to reduce the cost and a working time.

Figure 5:
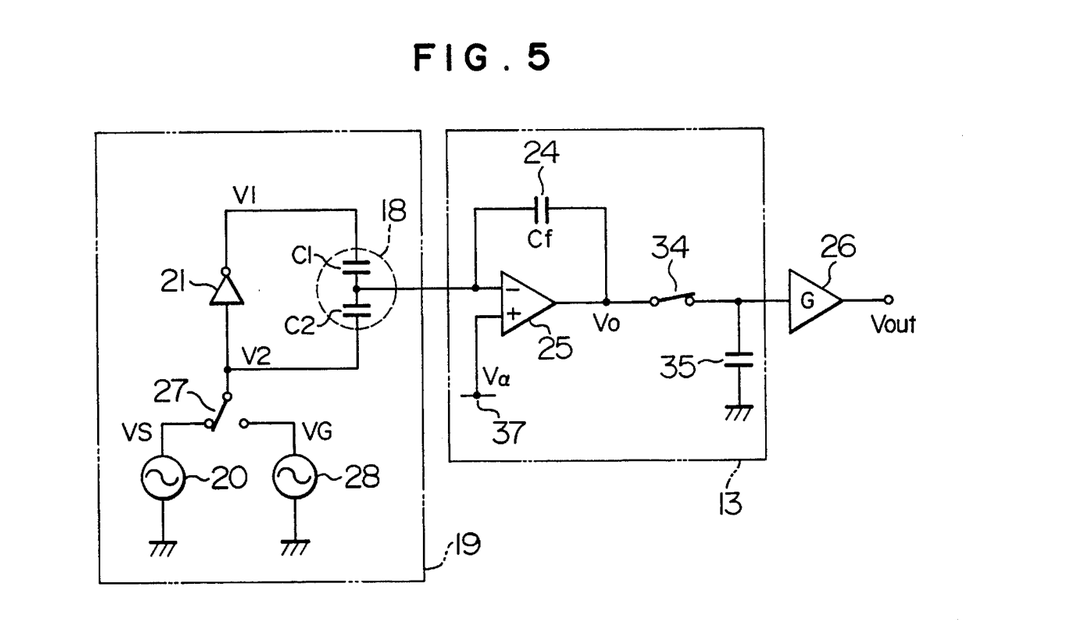
FIG. 5 is a circuit diagram showing an acceleration sensor according to another embodiment of the present invention.

FIG. 5 shows the circuit construction of another embodiment of the present invention. In the figure, the reference numerals as those used in the foregoing embodiment designate components which are the same as or equivalent to those in the foregoing embodiment.

The present embodiment is different from the foregoing embodiment in that a signal applicator 19 includes a first pulse generator 20 and a second pulse generator 28, the first pulse generator 20 generates a signal VS for acceleration detection, the second pulse generator 28 generates a signal VG for diagnosis, and the first and second pulse generators 20 and 28 are changed over by a switch 27.

Figure 6A:
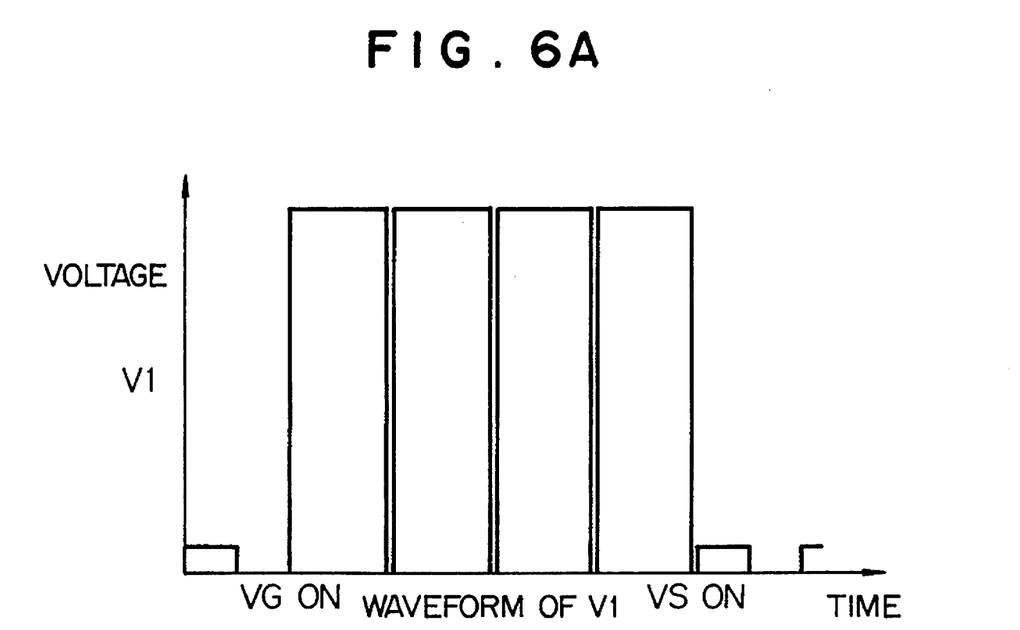
FIGS. 6A and 6B show voltage waveforms applied to a sensing device in the embodiment shown in FIG. 5.
Figure 6B:
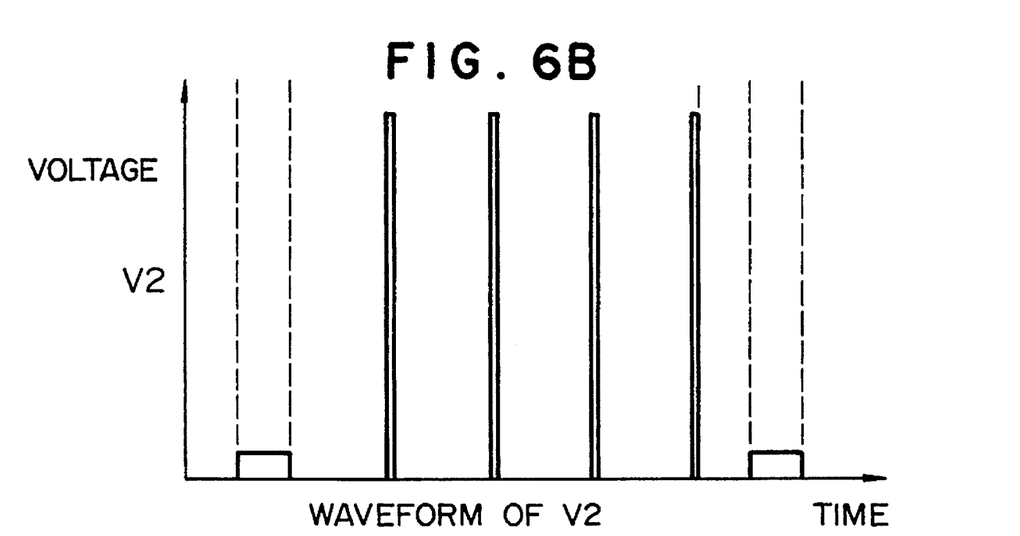

FIG. 6 shows the waveforms of voltages applied to a sensing device 18.

In a diagnosis mode, the switch 27 is connected to the second pulse generator 28. The pulse of the second pulse generator 28 has an amplitude VG higher than the amplitude Vs of the pulse of the first pulse generator 20 and a duty ratio (for example, 95 to 99%) larger than the pulse of the first pulse generator 20.

With such a construction, when the pulse voltage VG is applied to the sensing device 18, an electrostatic force is exerted to displace a movable electrode from its reference position. By detecting the amount of displacement of the movable electrode at this time and a temporal change thereof from a sensor output, it is possible to self-diagnose a failure of the sensor, a change in characteristic thereof and so on.

An output voltage Vo of an operational amplifier 25 at this time can be represented by the following equation:

$$Vo = -(C1-C2)VG/Cf + V\alpha. \qquad (9)$$

Equation (9) is equivalent to one in which the voltage VS in equation (4) in the embodiment shown in FIGS. 2A and 2B is replaced by the voltage VG (VS<VG).

Accordingly, the present embodiment provides an effect that the diagnosis of a sensor can be made accurately with an improved sensitivity. Further, there is an effect that a more simple circuit construction can be provided since an adder circuit is not required.

Figure 7:
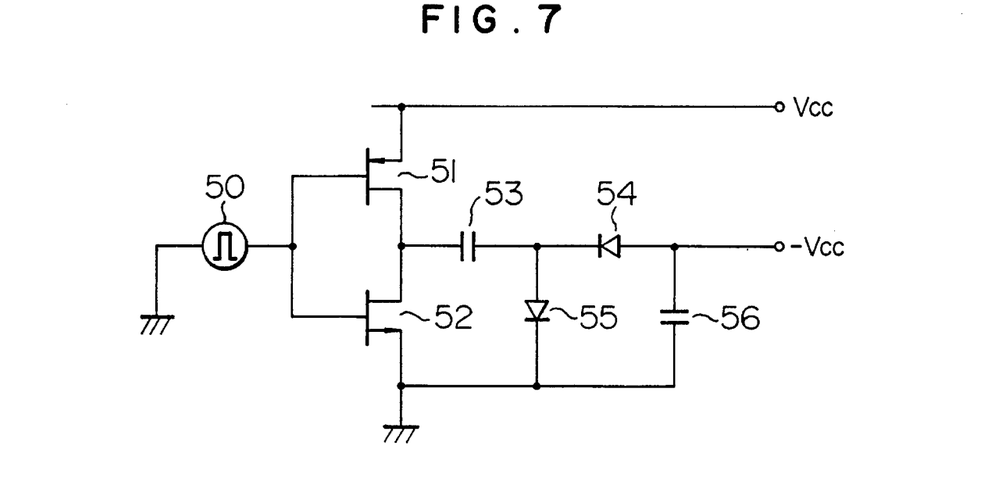
FIG. 7 is a circuit diagram showing an example of a boosting circuit used in the embodiment shown in FIG. 5.

FIG. 7 shows an example of a self-boosting circuit which can be applied to the embodiments mentioned above.

A power supply voltage of the sensor is usually about 5 V or relatively low. Therefore, it is effective to boost a voltage for self-diagnosis.

The boosting circuit shown in FIG. 7 is a charge pump circuit composed of a pulse generator 50 (for which the pulse generator 20 may be substituted), FET's 51 and 52, capacitors 53 and 56, and diodes 54 and 55. Charges stored in the capacitor 53 by the turn-on/off of the transistors 51 and 52 are stored into the capacitor 56. This is repeated at an oscillation frequency of the pulse generator to obtain a boosted voltage which is substantially near to −VCC. This circuit can generate a potential difference which is about two times as large as VCC.

This potential difference is stored in a capacitor or the like and a voltage is regulated to a predetermined value VG which is to be used as the voltage for self-diagnosis. In the case where a voltage larger than 2 VCC is required, a required number of circuits shown in FIG. 7 may be connected in series.

With the above construction, there is an effect that a boosted voltage for self-diagnosis can be realized with a simple circuit construction and the circuit can be integrated or configured into an integrated circuit form.

Figure 8:
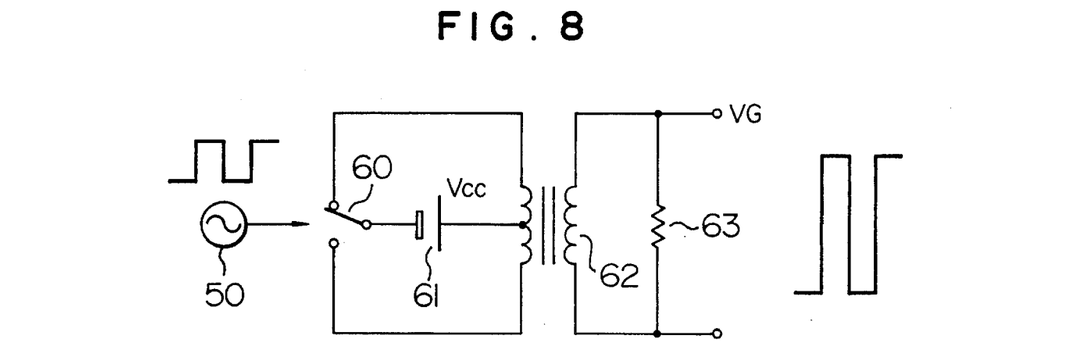
FIG. 8 is a circuit diagram showing another example of a boosting circuit used in the embodiment shown in FIG. 5.

FIG. 8 shows another example of a boosting circuit.

The boosting circuit of this example includes a pulse generator 50 (for which the pulse generator 20 may be substituted), a switch 60, a power supply voltage 61, a transformer 62 and a resistor 63. With such a circuit construction, there is an effect that a further boosted voltage can easily be generated.

Even if a boosting circuit is not specially provided, a battery incorporated in a vehicle can also be used.

Figure 9:
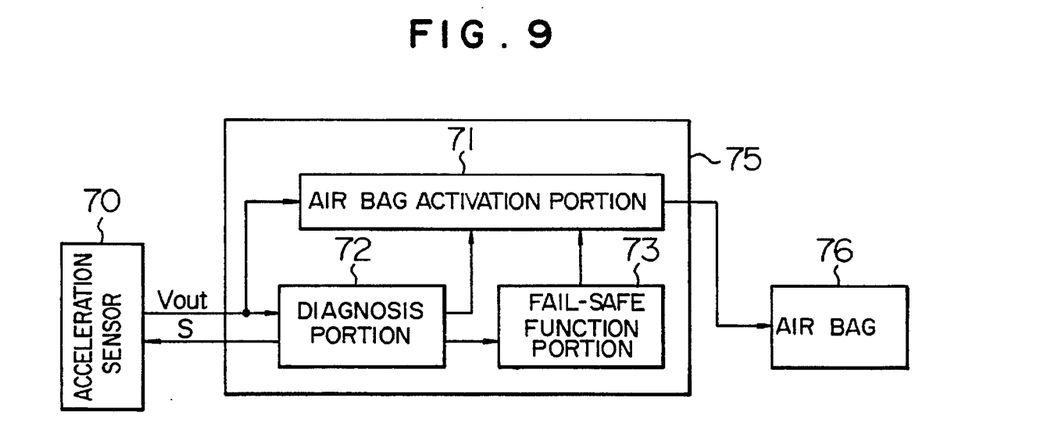
FIG. 9 is a block diagram showing an example in which an acceleration sensor of the present invention is applied to an air bag system.

FIG. 9 shows an embodiment of the construction of an air bag system.

The air bag system of the present embodiment includes an acceleration sensor 70, a microcomputer 75 and an air bag 76. The microcomputer 75 is composed of an air bag activation portion 71, a diagnosis portion 72 and a fail-safe function portion 73. A capacitance type sensor as mentioned above can be used as the acceleration sensor 70.

Figure 10:
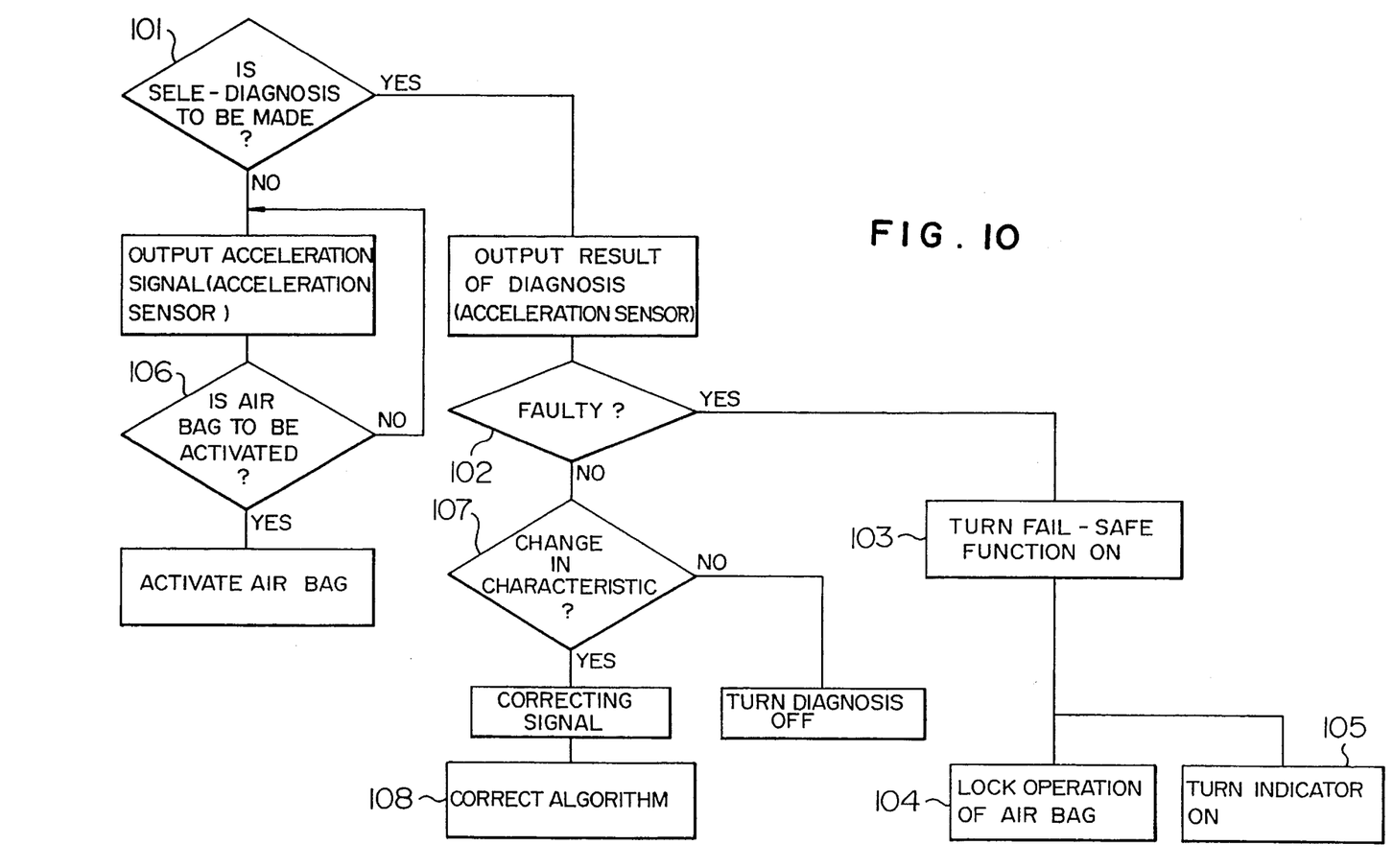
FIG. 10 is a flow chart for explaining the circuit operation of the example shown in FIG. 9.

A flow chart for a control of the air bag system will be explained using FIG. 10.

In the usual case where a diagnosis start signal is not outputted from the diagnosis portion 72 (or self-diagnosis is not conducted), an acceleration signal outputted from the acceleration sensor 70 controls the air bag 76 through a step 106 of judging whether or not the air bag 76 is to be operated by the air bag activation portion 71.

When self-diagnosis is to be made (or in the case where the judgement in step 101 is affirmative), the diagnosis start signal is outputted from the diagnosis portion 72 to turn the acceleration sensor 70 into a diagnosis mode. A signal is inputted to the diagnosis portion 72 again to judge whether or not the sensor is faulty (step 102). In the case where the sensor is faulty, the fail-safe function portion 73 is operated (step 103), thereby locking the operation of the air bag activation portion 71 to prevent an erroneous operation of the air bag 76 (step 104) and informing a driver of a failure by an indicator or the like (step 105).

In the case where a diagnosis signal from the acceleration sensor 70 shows a change in characteristic (or the judgement in step 107 is affirmative), a correcting signal from the diagnosis portion 72 is outputted to the air bag activation portion 71. In step 108, an algorithm is corrected which makes the judgement of whether or not the air bag is to be activated.

With the above system construction, the reliability of the system can be improved as compared with that of the conventional system.

Figure 11:
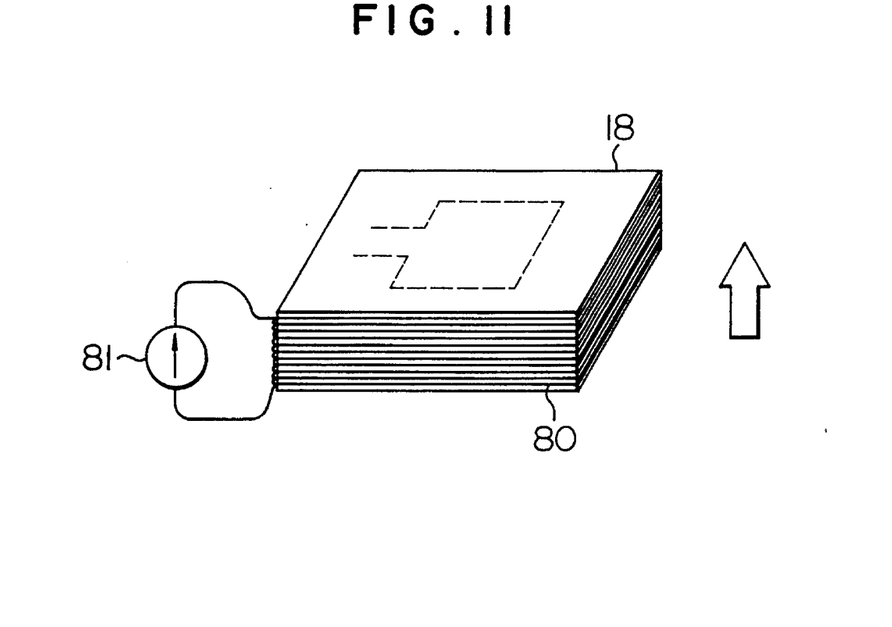
FIG. 11 is a perspective view showing another embodiment of a sensing device.

FIG. 11 shows another embodiment of self-diagnosis in the present invention.

In the present embodiment, a fine wire or line 80 such as a metal wire is wound in a coil form about a sensing device 18 so that an electromagnetic force is exerted in a upward direction to displace the movable electrode in the upward direction. It is possible to make the self-diagnosis of a sensor on the basis of the magnitude of the electromagnetic force and the amount of displacement of the movable electrode 6 (or ultimately a change in ΔC). Numeral 81 denotes a D.C. current source.

Such a construction also provides an effect that self-diagnosis can easily be made.

Figure 12:
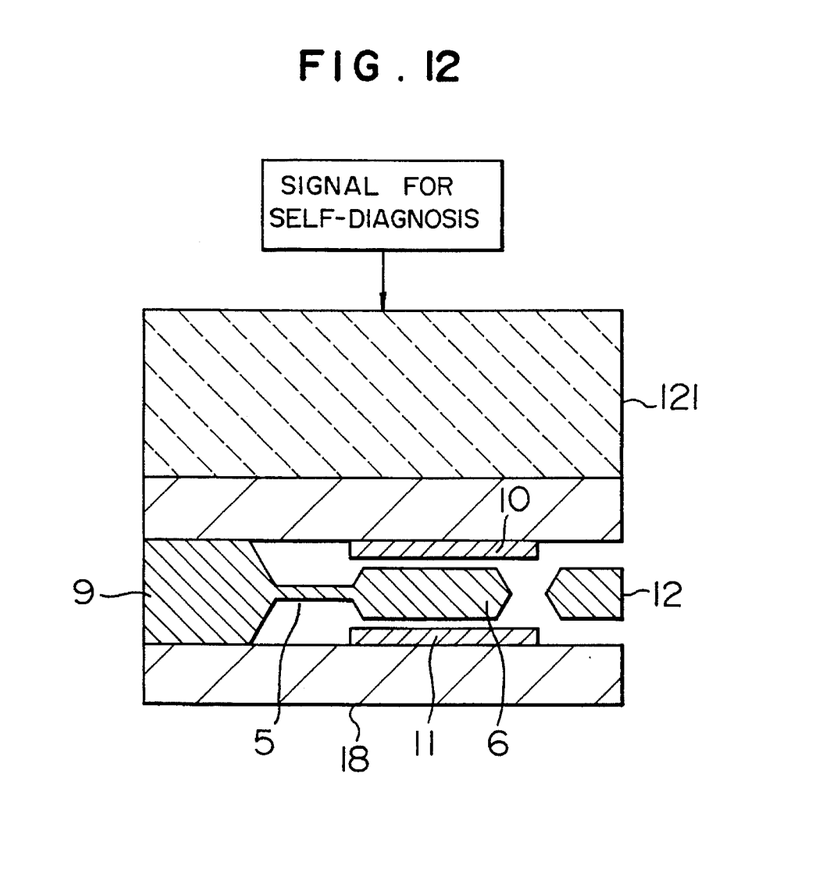
FIG. 12 is a schematic cross section showing a further embodiment of an acceleration sensor according to the present invention.

FIG. 12 shows another embodiment of the present invention.

In the present embodiment, a piezoelectric element 121 made of a ceramic or the like is secured on the upper (or lower) side of the sensing device 18. When an electric signal is applied to the piezoelectric element 121, the element 121 oscillates due to a piezoelectric effect, thereby applying the acceleration of oscillation to the sensing device 18. It is possible to make the self-diagnosis of a failure of the sensor from the signal applied to the piezoelectric element 121 and an output signal from the sensing device 18.

With such a construction, since an acceleration can actually be generated to make diagnosis, there is an effect that the self-diagnosis can be made with a higher reliability and a high precision.

The present invention can be applied to an apparatus for inspection of sensors or systems prior to delivery.

Means or diagnosing system similar to that shown in the foregoing embodiments can be constructed in a strain gage or piezoresist type acceleration sensor provided with a dead weight which serves as a mass part and an elastic support with strain gage or piezoresist which supports the dead weight.

For example, the dead weight is formed by micromachining semiconductor, a fixed electrode for the exclusive use for diagnosis is disposed opposite to the dead weight, an electrostatic force based on a signal for diagnosis is exerted between the dead weight and the fixed electrode, and the self-diagnosis of an acceleration sensor is made by detecting a change in resistance value of the strain gage or detecting a change in capacitance between the dead weight and the fixed electrode upon generation of the signal for diagnosis.

According to the present invention mentioned above, the notice of the abnormality of an acceleration sensor such as a failure of the sensor or the deterioration in performance thereof can be given by making the self-diagnosis of the acceleration sensor. Thereby, the reliability of the system can be improved.

The change of an output characteristic of the sensor caused from the lapse of time can also be diagnosed. If a correction for the characteristic is made on the basis of the result of diagnosis, the soundness of the sensor or the system can be maintained without making the interchange of sensing devices.

We claim:

1. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part applies one of an electrostatic force, an electromagnetic force and an external mechanical oscillation to said mass part on the basis of said diagnosis signal, wherein the acceleration sensor is a capacitance type acceleration sensor which detects the acceleration from a change in capacitance between a movable electrode serving as said mass part and a fixed electrode disposed opposite to said movable electrode, said means for applying said force corresponding to said predetermined acceleration to said mass part includes signal applying means for applying said diagnosis signal to said fixed electrode to generate an electrostatic force for displacing said movable electrode, and said self-diagnosing means detects a change in capacitance between said movable electrode and said fixed electrode upon generation of said diagnosis signal to diagnose the acceleration sensor.

2. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part applies one of an electrostatic force, an electromagnetic force and an external mechanical oscillation to said mass part on the basis of said diagnosis signal, wherein the acceleration sensor is piezoresistive type acceleration sensor provided with a dead weight which serves as said mass part and an elastic support with a piezoresistive member which supports said dead weight, said means for applying said force corresponding to said predetermined acceleration to said mass part includes a fixed electrode for the exclusive use for diagnosis disposed opposite to said dead weight and signal applying means for applying said diagnosis signal to said fixed electrode to generate an electrostatic force for displacing said dead weight, and said self-diagnosing means detects a change in resistance value of said piezoresistive member or a change in capacitance between said dead weight and said fixed electrode upon generation of said diagnosis signal to diagnose the acceleration sensor.

3. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part includes a coil for generating an electromagnetic force on the basis of said diagnosis signal, said coil being wound about the acceleration sensor.

4. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part applies one of an electrostatic force, an electromagnetic force and an external mechanical oscillation to said mass part on the basis of said diagnosis signal, wherein said self-diagnosing means has a function of diagnosing the presence and/or absence of a failure of the acceleration sensor from said diagnosis signal and the value of the output of the acceleration sensor or said diagnosis signal and a temporal change of the output value of the acceleration sensor until it reaches a predetermined level.

5. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part applies one of an electrostatic force, an electromagnetic force and an external mechanical oscillation to said mass part on the basis of said diagnosis signal, wherein said self-diagnosing means has a function of self-diagnosing a static characteristic of the acceleration sensor from said diagnosis signal and the value of the output of the acceleration sensor, said status characteristic of the acceleration sensor being a sensor output value characteristic which is to be primarily obtained for the acceleration.

6. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said means for applying said force corresponding to said predetermined acceleration to said mass part applies one of an electrostatic force, an electromagnetic force and an external mechanical oscillation to said mass part on the basis of said diagnosis signal, wherein said self-diagnosing means has a function of diagnosing a dynamic characteristic of the acceleration sensor from said diagnosis signal and a temporal change of the value of the output of the acceleration sensor until it reaches a predetermined level, said dynamic characteristic of the acceleration sensor being a sensor output transient response for the acceleration.

7. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said diagnosis signal is amplified using a charge pump circuit configured into an integrated circuit form and an amplified signal voltage is applied to said means for applying said force corresponding to said predetermined acceleration.

8. An apparatus for self-diagnosing a characteristic of an acceleration sensor provided with a mass part displaced in accordance with an acceleration for converting the displacement of said mass part into an electric signal to detect the acceleration of a moving object, comprising means for applying a force corresponding to a predetermined acceleration to said mass part by applying a signal for diagnosis to the acceleration sensor, means for self-diagnosing the characteristic of the acceleration sensor from an output of the acceleration sensor upon generation of said diagnosis signal, means for giving notice of a failure of the acceleration sensor in the case where the result of self-diagnosis by said self-diagnosing means determines the failure of the acceleration sensor, and means for correcting an output characteristic of the acceleration sensor in the case where the result of self-diagnosis by said self-diagnosing means determines that the output characteristic of the acceleration sensor has a change which is caused from a lapse of time, wherein said diagnosis signal is amplified using a transformer and an amplified signal voltage is applied to said means for applying said force corresponding to said predetermined acceleration.

9. An apparatus according to claim 1, wherein when said diagnosis signal is generated, a battery supply voltage is applied directly to said fixed electrode.

10. An apparatus according to claim 3, wherein when said diagnosis signal is generated, a battery supply voltage is applied directly to said fixed electrode.

* * * * *